United States Patent [19]

Pigeon

[11] 4,290,869
[45] Sep. 22, 1981

[54] PHOTOPOLYMERIZABLE ORGANOPOLYSILOXANE/SILANE COMPOSITIONS

[75] Inventor: Raymond Pigeon, Francheville, France

[73] Assignee: Rhone-Poulenc Industries, Paris, France

[21] Appl. No.: 114,340

[22] Filed: Jan. 23, 1980

[30] Foreign Application Priority Data

Jan. 24, 1979 [FR] France ............................ 79 01750

[51] Int. Cl.³ .............................................. C08F 2/46
[52] U.S. Cl. .......................... 204/159.13; 260/18 S;
428/438; 428/439; 428/443; 428/447; 428/449;
428/452; 428/523; 428/526; 528/17; 528/18;
528/30; 528/32; 528/901
[58] Field of Search ................ 528/30, 17, 18, 32,
528/901; 204/159.13; 428/438, 439, 443, 447,
449, 452, 523, 526; 260/18 S

[56] References Cited

U.S. PATENT DOCUMENTS

| | | | |
|---|---|---|---|
| 3,714,089 | 1/1973 | Hamilton et al. | 528/901 |
| 3,816,282 | 6/1974 | Viventi | 528/30 |
| 4,039,504 | 8/1977 | Homan et al. | 528/30 |
| 4,039,505 | 8/1977 | Homan et al. | 528/32 |
| 4,064,027 | 12/1977 | Gant | 528/32 |
| 4,066,603 | 1/1978 | Homan et al. | 528/32 |
| 4,070,526 | 1/1978 | Colquhoun et al. | 528/32 |
| 4,208,471 | 6/1980 | Bresak et al. | 528/32 |

*Primary Examiner*—Melvyn I. Marquis
*Attorney, Agent, or Firm*—Burns, Doane, Swecker & Mathis

[57] ABSTRACT

Photopolymerizable, liquid, storage stable organopolysiloxanes having viscosities of from 60 mPa.s to 2,000 mPa.s at 25° C., are prepared by reacting (i) an $\alpha,\omega$-dihydroxydiorganopolysiloxane oil having a viscosity ranging from about 70 to 500 mPa.s at 25° C., with (ii) a silane having the formula $Z(G)SiR_a(Q)_{3-a}$ wherein Z is $CH_2=C(R')-COO-$ or $HS-$, and further wherein the symbols R, which may be the same or different, are methyl, ethyl, n-propyl, vinyl or phenyl, R' is hydrogen or methyl, the symbols Q, which may be the same or different, are methoxy, ethoxy, n-propoxy, $\beta$-methoxyethoxy and, when any two are taken together, the divalent radical $-O-(CH_3)_2-C(CH_3)_2-O-$, G is a linear or branched chain alkylene radical having from 1 to 8 carbons, and a is a number ranging from 0 to 2; and with the molar ratio of the hydroxyl functions comprising the oil (i) to the Q radicals comprising the silane (ii) ranging from 0.1 to 0.95. Such organopolysiloxanes are useful, e.g., release coating compositions.

43 Claims, No Drawings

PHOTOPOLYMERIZABLE ORGANOPOLYSILOXANE/SILANE COMPOSITIONS

BACKGROUND OF THE INVENTION

1. Field of the Invention:

The present invention relates to the preparation of photopolymerizable, liquid, storage stable organopolysiloxane compositions and, more especially, to the preparation of such organopolysiloxanes by reaction between an $\alpha,\omega$-dihydroxydiorganopolysiloxane oil and an alkoxysilane functional monomer, said alkoxysilane bearing functional groups directly covalently bonded to the silicon atoms thereof, and such functional groups being selected from the group consisting of methacryloxyalkyl, acryloxyalkyl and mercaptoalkyl radicals.

2. Description of the Prior Art:

It is known to this art to prepare liquid organopolysiloxanes by reaction between an hydroxylated organopolysiloxane and an alkoxysilane functional monomer bearing, directly covalently bonded to the silicon atoms thereof, methacryloxyalkyl or acryloxyalkyl functional groups. Compare French Pat. Nos. 1,522,607 and 2,110,115; U.S. Pat. No. 3,782,940. Nonetheless, the operating conditions set forth in the foregoing prior art patents for their respective processes are insufficiently exacting as to enable repeatable and/or reliable production of such organopolysiloxanes, especially of those which are both storage stable and can be used in the absence of solvents therefor; not atypically polymers are prepared which gel upon storage and/or which (after the addition of photosensitizers thereto) are cured into coatings exhibiting but average, and ofttimes inferior, anti-stick or release properties. And this in spite of the fact that exceedingly long periods of exposure to curing radiation be employed, e.g., exposure times in excess of 50 seconds.

The published Japanese application, Kokai No. 78/118,500, also described a process for the reaction of $\alpha,\omega$-dihydroxypolysiloxanes with trialkoxysilanes bearing methacryloxyalkyl or acryloxyalkyl functional groups, at elevated temperatures and in the presence of an alcohol having a boiling point at least 150° C. higher than that of the aliphatic alcohol generated during the reaction. However, the process has the disadvantages of being quite slow and yielding condensates having a low viscosity and which only very slowly cross-link under the influence UV radiation.

Organopolysiloxanes related in structure to those noted hereinabove, but prepared by yet another process, are described in published French application No. 2,192,137. Such process includes reacting, in an aprotic solvent and in the presence of a basic catalyst, an alkoxysilane bearing methacryloxyalkyl or acryloxyalkyl functional groups, with a cyclic or linear organopolysiloxane. This method requires the use of solvents which is always a marked disadvantage on an industrial scale; it further entails the rearrangement of the siloxane bonds, which leads to a very complex mixture of polymers.

Certain photopolymerizable compositions which find use in the treatment of paper to impart anti-stick properties thereto, and which comprise, in addition to photosensitizers, diorganopolysiloxane moieties including unsaturated ethylene radicals, and particularly methacryloxypropyl radicals, too have been disclosed to the art, in U.S. Pat. No. 3,726,710. These methacryloxypropyl radicals are principally attached along the chain of the diorganopolysiloxane polymers and not at the ends of the chain. To introduce such radicals along the chain, or polymer backbone, it is necessary to employ a method that is considerably more complex than that consisting of simply reacting $\alpha,\omega$-dihydroxydiorganopolysiloxanes with alkoxysilanes bearing methacryloxypropyl radicals. The text of the patent does not provide detailed information concerning specific methods that may be used; nevertheless, any process effecting conventional substitution would be appropriate.

Such process, thus, may consist of preparing, in a first stage, $\alpha,\omega$-bis(triorganosiloxy)-diorganopolysiloxane polymers (not readily available on the silicone market) bearing pendant chloroalkyl radicals along the polymer chains bonded to silicon atoms and subsequently reacting, in a solvent and in the presence of an HCl acceptor, the chloroalkyl radicals with methacrylic and acrylic acids. Such a process is not only time consuming, but requires an inordinate degree of care to obtain a high rate of substitution.

It is also known to prepare other types of liquid organopolysiloxanes by the reaction of $\alpha,\omega$-dihydroxydiorganopolysiloxanes with alkoxysilanes bearing mercaptoalkyl functional groups; U.S. Pat. No. 4,066,603. In this process, the reactants are maintained in contact, in the presence of a basic catalyst such as caustic potash or a potassium silanolate, and the alcohol formed during the reaction is completely eliminated via a devolatilization stage; the use of this type of catalyst suggests, at the completion of the reaction, the employment of a neutralization stage (in order to prevent product evolution during storage) and likely a filtration stage. Such a process is indeed complex and in need of improvement.

Organopolysiloxanes which are photopolymerizable upon the addition of photosensitizers thereto, and comprised of organopolysiloxanes bearing alkenyl radicals bonded to silicon atoms, even organopolysiloxane polymers comprising SiH moieties and silanes or organopolysilanes bearing mercaptoalkyl functional groups, are described in numerous patents, e.g., French Pat. Nos. 2,245,729, 2,246,608, 2,257,736 and 2,622,126. Such compositions are capable of being processed into adequate anti-stick coatings, but same do not as yet possess all of the necessary properties as would favor their industrial development. Such properties would have to comprise at least the following: ease of preparation of the various components; good, mutual compatibility of the several components; low viscosity; and rapid hardening or curing of the polymers upon exposure to ultraviolet radiation.

SUMMARY OF THE INVENTION

Accordingly, a major object of the present invention is the provision of a novel class of photopolymerizable, liquid, storage stable organopolysiloxane compositions, which compositions are low in viscosity and, upon exposure to UV radiation, are rapidly cured into, e.g., tough and durable surface coatings characterized by enhanced anti-stick or release properties.

Briefly, the subject compositions have viscosities of from 60 mPa.s to 20,000 mPa.s at 25° C. and comprise methacryloxyalkyl, acryloxyalkyl and/or mercaptoalkyl functional groups directly covalently bonded to the silicon atoms of the polymer chain; same are conveniently prepared by first intimately admixing:

(i) an α,ω-dihydroxydiorganopolysiloxane oil, the organo functions thereof being directly covalently bonded to the silicon atoms comprising the polysiloxane chain and being selected from the groups consisting of methyl, ethyl, n-propyl, vinyl, phenyl and trifluoropropyl, with at least 70% of such functions being methyl radicals and no more than 3% being vinyl radicals;

(ii) a silane having the general formula $Z(G)SiR_a(Q)_{3-a}$ wherein the symbol Z represents the radical $CH_2=C(R')-COO$ or the radical HS; the symbols R, which may be the same or different, represent methyl, ethyl, n-propyl, vinyl or phenyl radicals, the symbol R' represents a hydrogen atom or a methyl radical, the symbols Q, which may be the same or different, represent methoxy, ethoxy, n-propoxy or β-methoxyethoxy radicals, and any two of the symbols Q, taken together, can represent a radical of the formula:

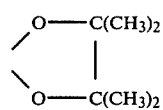

the symbol G represents a linear or branched chain alkylene radical having from 1 to 8 carbon atoms, and the symbol a represents a value from zero to 2; and (iii) a catalyst selected from the group consisting of the alkyl titanates and polytitanates and the diorganotin salts of aliphatic carboxylic acids.

The three components of the reaction recipe are present in a proportion of 0.05 to 2 parts by weight catalyst (iii) per 100 parts by weight of the mixture of oil (i) and silane (ii), and same are interreacted simply by bringing the recipe to a temperature of from 5° to 180° C.

DETAILED DESCRIPTION OF THE INVENTION

More particularly according to the invention, [a] the oils (i) have viscosities ranging from 70 to 500 mPa.s at 25° C., [b] the oils (i) and the silanes (ii) are mixed in proportions such that the molar ratio of the free hydroxyl functions comprising the oils to the Q radicals of the silanes is between 0.1 to 0.95, and [c] the three reactants (i), (ii) and (iii) are maintained in contact for such period of time as is necessary to eliminate, at most, 45% of that theoretical amount of QH alcohol formed during the course of the reaction from the OH radicals comprising the oils (i) and the Q radicals comprising the silanes (ii).

In another embodiment of the invention, the three reactants (i), (ii) and (iii) may simply be maintained in contact for at least 10 hours, at a temperature ranging from 5° to 90° C., without the substantial evolution of any QH alcohol.

The α,ω-dihydroxydiorganopolysiloxane oils (i) have a viscosity ranging from 70 to 500 mPa.s at 25° C., preferably from 80 to 400 mPa.s at 25° C.; these are linear polymers consisting essentially of diorganosiloxy units of the formula $Y_2SiO$ and terminated at each end of their chains by a hydroxyl radical; however, the presence of monoorganosiloxy units of the formula $YSiO_{1.5}$ and/or of siloxy units of the formula $SiO_2$ is permitted, up to a maximum of 1% by weight with respect to the total number of diorganosiloxy units.

The symbols Y, which may be the same or different, represent methyl, ethyl, n-propyl, vinyl, phenyl and 3,3,3-trifluoropropyl.

Exemplary of the units represented by the formula $Y_2SiO$ are those having the following formulae:

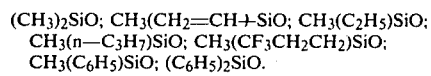

$(CH_3)_2SiO$; $CH_3(CH_2=CH)SiO$; $CH_3(C_2H_5)SiO$; $CH_3(n-C_3H_7)SiO$; $CH_3(CF_3CH_2CH_2)SiO$; $CH_3(C_6H_5)SiO$; $(C_6H_5)_2SiO$.

The oils (i) typically are off-the-shelf items of the silicone manufactures. In addition, they may be prepared simply by the hydrolysis of diorganodichlorosilanes or of diorganodiacetoxysilanes in an aqueous medium comprising a base, such as ammonia or sodium bicarbonate.

Other processes for their preparation too may be employed, for example the polymerization of hexaorganocyclotrisiloxanes, in the presence of acid activated clay in a water/acetone medium; U.S. Pat. No. 3,853,932.

The silanes (ii) either have the formula $F_1$: $CH_2=C(R')-COO(G)SiR_a(Q)_{3-a}$ when Z represents the radical $CH_2=C(R')-COO$, or the formula $F_2$: $HS(G)SiR_a(Q)_{3-a}$ when Z represents the radical HS, and wherein the symbols R, R', Q, G and a are as above defined.

More particularly, the symbol G represents an alkylene radical having 1 to 8 carbon atoms, selected, for example, from among those of the formula $-(CH_2)_n-$ wherein n is an integer from 1 to 8, and those of the formulae: $-CH_2CH(CH_3)CH_2-$; $-CH_2CH_2CH(CH_3)CH_2-$; $-(CH_2)_4CH(C_2H_5)CH_2-$.

Exemplary silanes having the formula $F_1$ are those having the structural formulae:

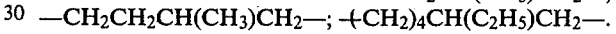
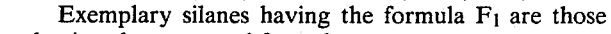
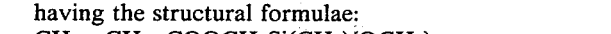
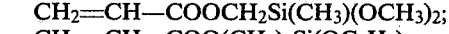
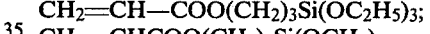
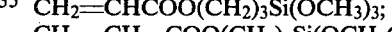
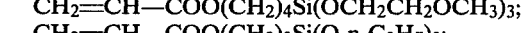
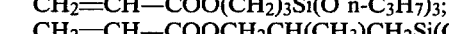
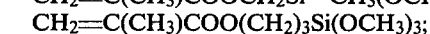
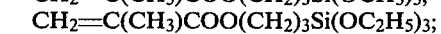
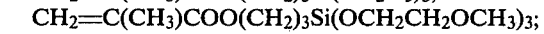
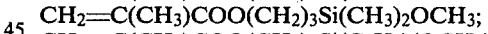
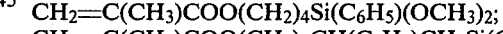
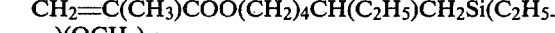

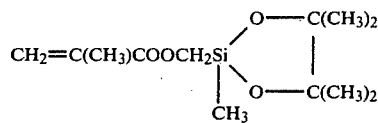

These silanes may be prepared by reaction of intermediates of the formula $Cl-G-SiR_a(Q)_{3-a}$ with organic acids of the formula $CH_2=C(R')COOH$. The reaction is advantageously conducted in an organic aprotic solvent such as N-methylpyrrolidone-2, N,N-dimethylformamide, and in the presence of an HCl acceptor such as triethylamine. In place of the organic acids, their alkali metal salts may be used; in this case, it is unnecessary to utilize an HCl acceptor in the reaction mixture. The silanes too are readily available on the silicone market.

Exemplary silanes having the formula $F_2$ are those having the structural formulae:

HS(CH₂)₃Si(OCH₃)₃; HSCH₂SiCH₃(OC₂H₅)₂;
HS(CH₂)₄SiCH₃(OCH₃)₂;
HS(CH₂)₄Si(CH₃)₂OC₂H₅;
HSCH₂CH(CH₃)CH₂SiCH₃(OC₂H₅)₂;
HS(CH₂)₃SiCH₃(OC₂H₅)₂;
HS(CH₂)₃SiCH=CH₂(OC₂H₅)₂;
HS(CH₂)₃SiC₆H₅(OCH₃)₂;
HSCH₂CH(CH₃)CH₂Si(OC₂H₅)₃.

The mercaptosilanes may conveniently be prepared by the decomposition of isothiouronium salts of the formula:

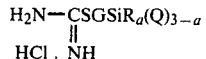

in the presence of an alkaline agent such as ammonia; U.S. Pat. No. 3,314,982. Same may also be purchased on the silicone market.

The catalysts (iii) are selected from among the alkyl titanates and polytitanates and the diorganotin salts of aliphatic carboxylic acids, and are employed in amounts of from 0.05 to 2 parts, preferably 0.1 to 1 part, per 100 parts of the total mixture of the oils (i) with the silanes (ii).

The alkyl titanates correspond to those of the general formula Ti[(OCH₂CH₂)$_b$OR″]₄ wherein the symbols R″, which may be the same or different, represent alkyl radicals having from 1 to 8 carbon atoms and the symbol b represents zero to 1; when the symbol b represents zero, the alkyl radicals contain from 2 to 8 carbon atoms, such as ethyl, n-octyl, n-propyl, isopropyl, n-butyl, isobutyl, sec-butyl, n-pentyl, n-hexyl, 2-ethylhexyl and n-heptyl, and when the symbol b represents 1, the alkyl radicals are either methyl or ethyl.

Exemplary of the aforesaid alkyl titanates are ethyl, n-propyl, isopropyl, n-butyl, 2-ethylhexyl and β-methoxyethyl titanate.

The alkyl polytitanates are prepared via the partial hydrolysis of titanates of the formula Ti(OR″)₄; this formula corresponds to that given immediately above wherein the symbol b represents zero; the symbol R″ represents, therefore, an alkyl radical having from 2 to 8 carbon atoms.

These polytitanates comprise linear structures, each consisting of recurring units of the formula —TiO(OR″)₂—, and/or the more complex structure noted in the work, *The Organic Chemistry of Titanium* by R. Feld and P. L. Cone, pages 25 to 31, published by Butterworths, London.

The precise synthesis of these polytitanates closely depends on the operating conditions for the hydrolysis of the titanates of the formula Ti(OR″)₄, on the titanate/water of hydrolysis molar ratio, and on the nature of the R″ radicals.

However, such polytitanates must be storage stable in storage and soluble in the conventional hydrocarbon solvents, such as toluene, xylene, cyclohexane, in a proportion of at least 50 parts per 100 parts of the solvent.

The diorganotin salts of the aliphatic carboxylic acids correspond to the formula (R‴COO)₂SnT₂ wherein the symbols R‴, which may be the same, or different represent aliphatic hydrocarbon radicals having from 1 to 25 carbon atoms; the symbols T, which may be the same or different, represent alkyl radicals having from 1 to 10 carbon atoms.

The aliphatic hydrocarbon radicals represented by the symbols R‴ comprise the linear or branched chain alkyl and alkenyl radicals. Exemplary of such alkyl radicals are: methyl, ethyl, n-propyl, isopropyl, n-butyl, n-hexyl, 2-ethylhexyl, n-octyl, n-decyl, n-dodecyl, n-tetradecyl, n-pentadecyl, n-hexadecyl, n-octadecyl, n-eicosyl, n-docosyl, n-pentacosyl.

Exemplary of the R‴ alkenyl radicals are those having the following structural formulae:

CH₃CH=CH—CH₂— CH₃CH=CH—(CH₂)₃—;
CH₃—CH=CH(CH₂)₅—;
CH₃(CH₂)₄CH=CH(CH₂)₅—;
CH₃(CH₂)₇CH=CH(CH₂)₈—;
CH₃(CH₂)₄CH=CH—CH₂—CH=CH(CH₂)₈—;
CH₃(CH₂)₄—(CH=CH-CH₂)₄—(CH₂)₃—.

Further, as exemplary of the alkyl radicals having from 1 to 10 carbon atoms, represented by the symbol T, are the following: methyl, ethyl, isopropyl, n-propyl, n-butyl, isobutyl, n-pentyl, n-hexyl, n-octyl, n-decyl.

The diorganotin salts of the aliphatic carboxylic acids may be utilized either alone, as pure products, or in admixture; the latter are prepared, for example, by reaction of mixtures of carboxylic acids (deriving from the natural glycerides, such as copra or palm oils) with diorganotin oxides.

Exemplary of such diorganotin salts are those having the following structural formulae:

(CH₃—COO)₂Sn(n—C₄H₉)₂;
[CH₃(CH₂)₁₀COO]₂Sn(n—C₄H₉)₂;
[CH₃(CH₂)₁₀COO]₂Sn(CH₃)₂;
[CH₃(CH₂)₃CH(C₂H₅)COO]₂Sn(CH₃)₂;
[CH₃(CH₂)₃CH(C₂H₅)COO]₂Sn(n—C₄H₉)₂;
[CH₃(CH₂)₁₂COO]₂Sn(C₂H₅)₂;
[CH₃(CH₂)₁₄COO]₂Sn(C₂H₅)₂;
[CH₃(CH₂)₇CH=CH(CH₂)₈]₂Sn(n—C₄H₉)₂.

To carry out the process according to the invention, per the aforesaid, the oils (i), the silanes (ii) and the catalysts (iii) are first simply intimately admixed, in the proportions indicated.

Thus, the amounts admixed of the oils (i) and the silanes (ii) are such that the molar ratio of the hydroxyl radicals of the oils (i) to the alkoxyl radicals Q of the silanes (ii) is between 0.1 and 0.95, preferably between 0.2 to 0.85. A mixture having a molar ratio less than 0.1 is not especially desirable, because same implies the use of large amounts of silanes (ii), while a mixture having a molar ratio higher than 0.95 leads to the formation of organopolysiloxane compositions displaying poor storage stability and/or having but mediocre anti-stick or release properties after hardening.

As indicated hereinabove, the catalysts (iii) are admixed in a proportion of 0.05 to 2 parts, preferably 0.1 to 1 part, per 100 parts of the total amount of oils (i)+silanes (ii).

The mixtures formulated in the above manner are treated as follows

The three reactants (i), (ii) and (iii) are maintained in intimate contact at a temperature of from 5° to 180° C.; during this period of contact a maximum of 45% of the theoretical amount of the QH alcohol to be formed during the reaction, and based on the OH radicals of the oils (i) and the alkoxy radicals Q of the silanes (ii), is evolved. The duration of the intimate contact is a function of the means used to eliminate the alcohol and the thermal conditions. It is at least 5 minutes, preferably at least 15 minutes, and may even exceed several days. When operating at atmospheric pressure, at temperatures in excess of 100° C., e.g., on the order of 120° to 160° C., while permitting the aforenoted maximum percentage of the alcohol QH to escape, the contact time will not appreciably exceed 90 minutes. These contact times may be further reduced and be diminished, for example, to less than 60 minutes, by facilitating the elimination of the alcohol QH by means of the aid of a purging flow of inert carrier gas passing through and flushing the reaction mixture or by utilizing a pressure less than atmospheric.

It is not recommended to exceed a temperature of 180° C., because high viscosity compositions, unstable in storage, may be obtained.

When operating at much lower temperatures, e.g., on the order of 20° to 50° C., the reactants may be left in contact for at least 48 hours; the necessary amount of the QH alcohol is then eliminated at completion of the contact period by slight heating at a pressure less than atmospheric, or solely by the application of less than atmospheric pressure.

If during the process more than 45% of the theoretical amount of the byproduct alcohol QH is eliminated, the resultant compositions may tend to gel during storage.

According to another embodiment of the invention, the three reactants are maintained in intimate contact for at least 10 hours, at a temperature between 5° and 90° C., with no alcohol QH being eliminated during this period. This particular process embodiment is quite simple, but same requires rather lengthy reaction periods, which periods increase the lower the temperature. At temperatures of from about 5° to 20° C., the reactants must be contacted for at least 72 hours, but at a temperature of about 70° to 90° C., only twelve hours are required.

The choice of any particular mode of treatment will be a function of manufacturing conditions (duration of delays, heating means and the reactor equipment) and of the nature of the QH alcohol. A volatile QH alcohol, such as methanol or ethanol, will require fewer calories for its evolution by heating than will butanol or even hexanol.

The compositions obtained according to the invention have a viscosity ranging from 60 mPa.s to 20,000 mPa.s at 25° C., most frequently from 150 mPa.s to 15,000 mPa.s at 25° C.

These photopolymerizable organopolysiloxanes are storage stable in closed, opaque containers. The viscosity of certain of the subject compositions may, however, change somewhat during the first few weeks after their manufacture; in this period the viscosity may change, for example, from 300 mPa.s at 25° C. to 1000 mPa.s at 25° C., but it will then stabilize and will increase no further.

In light of above outlined procedure for the preparation of the subject compositions, same either comprise methacryloxyalkyl and/or acryloxyalkyl functional groups provided by the silanes of formula $F_1$ and directy covalently bonded to the silicon atoms thereof, or mercaptoalkyl functional groups provided by the silanes of formula $F_2$, likewise so directly covalently bonded.

The reaction products of the dihydroxydiorganopolysiloxane oils (i) with the silanes of the formula $F_1$, and thus comprising the methacryloxyalkyl and/or acryloxyalkyl functions shall hereafter be designated the compositions $E_1$; those being the reaction products of the oils with the silanes $F_2$ and comprising the mercaptoalkyl functions shall be designated the compositions $E_2$.

In another and important embodiment of the invention, there are envisaged photopolymerizable liquid compositions obtained:

(1) Either by mixing the compositions $E_1$ with the silanes of the formula $F_2$, with the respective amounts of the compositions $E_1$ and the silanes $F_2$ being such that the molar ratio of the radicals of the formula $CH_2=C(R')COO-$ provided by the compositions $E_1$ to the radicals of the formula HS—, provided by the silanes $F_2$, is greater than 0.05 and typically ranges from 0.05 to 15, preferably from 0.2 to 12; such compositions are hereby designated the compositions $H_1$, (2) By mixing the compositions $E_2$ with the silanes of the formula $F_1$, the respective amounts of the compositions $E_2$ and silanes $F_1$ being such that the molar ratio of the radicals of the formula $CH_2=C(R')COO-$, provided by the silanes $F_1$, to the radicals of the formula HS—, provided by the compositions $E_2$, is greater than 0.05 and typically ranges from 0.05 to 15, preferably from 0.1 to 8; such compositions are hereby designated the compositions $H_2$, (3) Or by mixing the compositions $E_1$ with the compositions $E_2$, the respective amounts of the compositions $E_1$ and $E_2$ being such that the molar ratio of the radicals of the formula $CH_2=C(R')COO-$, provided by the compositions $E_1$, to the radicals HS—, provided by the compositions $E_2$, is greater than 0.5 and typically ranges from 0.05 to 15, preferably from 0.1 to 10; such compositions are hereby designated the compositions $H_3$.

The immediately aforesaid liquid compositions have viscosities ranging from 60 mPa.s at 25° C. to 20,000 mPa.s at 25° C. When the molar ratio $CH_2=C(R')COO/SH$ is between 0.05 and 15, they are sensitive to radiation and preferably should be prepared at the very moment of their intended use; they are, however, storage stable in closed and opaque containers, for about 48 hours.

Each of the compositions $H_1$, $H_2$ and $H_3$ may be prepared by simply intimately admixing, at ambient temperature and atmospheric pressure, the aforenoted components. The processing of such compositions thus does not require that any particular precautions be taken; it is possible, nevertheless, when one or both components comprise alkoxy radicals Q, which are highly sensitive to hydrolysis (such as methoxy radicals) and further when the ambient air is very humid, to effect their admixture under a dry atmosphere, but this is not necessary in the majority of cases.

Within the limits of their mutual compatibility, the components of the compositions $H_1$, $H_2$ and $H_3$ may be admixed in any proportion; however, among the resulting compositions, those having a molar ratio of radicals of the formula $CH_2=C(R')COO$ to the radicals of the formula HS of less than 0.05 are of little interest insofar as imparting release characteristics to a variety of substrates is concerned.

In fact, the compositions $H_1$, $H_2$ and $H_3$ are principally intended, following addition of photosensitizers thereto, for the thin layer deposition thereof onto flat cellulosic or synthetic polymeric substrates; these thin layers are subsequently hardened or cured by exposure to radiation, and specifically to ultraviolet radiation. Coatings having good anti-stick or release properties with respect to adhesives, sticky, viscous or other wet substances are thus provided.

In addition to the $H_1$, $H_2$ and $H_3$ compositions, the $E_1$ compositions are also suitable for similar, industrial anti-stick applications, but not the $E_2$ compositions; the latter, after the addition of photosensitizers and hardening by means of exposure to radiation, do not always yield coatings having good resistance to gumming.

A further object of the present invention thus comprises compositions photopolymerizable by exposure to ultraviolet radiation, characterized in that same contain 100 parts by weight of formulations selected from among the compositions $E_1$, $H_1$, $H_2$ and $H_3$ and 0.1 to 10 parts, preferably 0.2 to 8 parts, of photosensitizers (or photoinitiators).

These photopolymerizable compositions are obtained by simple admixing, at ambient temperature and under atmospheric pressure, of the compositions $E_1$, $H_1$, $H_2$ or $H_3$ with the photosensitizers. The duration of mixing of these compositions with the photosensitizers is a function of the amount of the photosensitizers introduced and of their solubility in the compositions. Typically, a period of time of from 30 minutes to 3 hours is required.

The photosensitizers are preferably selected from among the derivatives of benzoin, xanthone and thioxanthone.

Exemplary of such photosensitizers are the following: the alkyl ethers or mixtures of alkyl ethers of benzoin (alkyl radical contains 1 to 6 carbon atoms) such as the n-propyl, isopropyl, n-butyl and isobutyl ethers; 3-chloroxanthone and 3-methoxyxanthone; and 2-chlorothioxanthone.

Other types of photosensitizers too may be employed, such as aromatic ketone derivatives, for example, acetophenone, benzophenone, and 4,4'-bis(dimethylamino)-benzophenone. However, these latter photoinitiators occasionally yield poorer results than those first noted, and, accordingly, should be combined with a co-initiator (for example, triethylamine or triethyl phosphate).

The subject photopolymerizable compositions are especially adopted as coatings to impart good release characteristics to substrates such as the cellulosics and the various synthetics. For such applications they are conveniently coated, in a basis weight of from 0.5 to 5 g/m$^2$, onto the surfaces of such substrates by means of simple coating apparatus adapted to various industrial processing equipment. These apparatus often consists of but several coating cylinders placed one above the other, the lowermost cylinder being in contact with the compositions to be coated and the upper cylinder with the particular surface to be coated; compare published French application No. 2,207,811.

The photopolymerizable compositions (deposited in this manner in the form of a thin layer) are hardened by means of exposure to ultraviolet radiation provided by xenon or mercury arc lamps having an emission spectrum between 250 and 450 nm. The exposure time is particularly short with respect to the $H_1$, $H_2$ and $H_3$ compositions having a molar ratio of $CH_2=C(R')COO$ radicals to SH radicals of between 0.05 and 15. In other words, the presence of the SH radicals contributes to a reduction in exposure time.

Nonetheless the photopolymerizable compositions of the invention may be applied to all materials which are or will be in contact with adhesives, viscous or sticky substances, or those releasing moisture or humidity. Such materials are of widely varying nature, type and origin. These comprise the many different varieties of paper (such as Kraft paper of any degree of refinement, crystal papers, sulfur papers), cardboards, vegetable parchments, papers coated with polyethylene or carboxymethylcellulose, sheets of regenerated cellulose (such as "cellophane") or cellulose acetate, sheets of synthetic plastic materials, such as polyethylene, polypropylene, polyethylene terephthalate, sheet metal, synthetic fibers, glass or asbestos fabrics, non-woven fiber materials, which may be based on cellulose fibers, synthetic fibers, or a mixture of both.

Materials thus rendered anti-stick can be used as inserts, load-bearing separators, transfer papers and films, and as packaging materials for sticky or adhesive goods such as pastries, confections, raw rubber, tars and bitumen, waxes, or for foodstuffs which are wet or evolve moisture, such as fish, meat, cheese, etc.

In order to further illustrate the present invention and the advantages thereof, the following specific examples are given, it being understood that same are intended only as illustrative and in nowise limitative. In said examples to follow, unless otherwise indicated, all parts and percentages are given by weight.

EXAMPLE 1

(a) Into a reactor equippped with an agitator, a thermometer and having a gooseneck fitted with suitable analyzer, the following ingredients were charged:

[i] 95.4 parts of an $\alpha,\omega$-dihydroxydimethylpolysiloxane oil having a viscosity of approximately 100 mPa.s at 25° C. and comprising 0.7% free hydroxyl groups; and

[ii] 4.6 parts of a silane having the structural formula: $CH_2=C(CH_3)COO(CH_2)_3Si(OCH_3)_3$ and 0.2 parts of tetraisopropyl titanate.

The molecular ratio of the free OH radicals in the oil to the $OCH_3$ functions of the silane was approximately 0.7.

The contents of the reactor were gradually heated from 23° to 150° C. over a period of 28 minutes; during this heating period 0.19 part methanol was collected in suitable collector located downstream from the analyzer. Because the calculated theoretical amount of methanol to be evolved was 1.26 parts, the percentage actually evolved amounted to approximately 15% of the theoretical. The clear liquid obtained had a viscosity of 1000 mPa.s at 25° C.

(b) To 100 parts of the liquid prepared under (a), 4 parts of a photoinitiator were added, said photoinitiator consisting of a mixture of the butyl ethers and isobutyl ethers of benzoin (in an approximately 50/50 weight ratio), and the mixture was agitated at ambient temperature for 2 hours.

The resultant mixture was next coated, in an amount of 2 g/m$^2$, onto a Kraft paper (prepared from a bleached pulp, refined to 64° Shopper) weighing 67 g/m$^2$, surfaced with the aid of cellulosic polymers and supercalendered.

The coating operation was carried out by means of coating apparatus comprising three cooperating coating rolls, located one above the other. The lowermost cylinder or roll is submerged in a vat filled with the mixture to be coated onto the paper and, upon rotation, impregnates the middle, transfer cylinder which is located immediately above said lowermost cylinder; the transfer cylinder in turn impregnates the uppermost actual coating cylinder which is permanently in contact with, and continuously coats, the sheet of paper.

The silicone layer coated onto the paper was hardened or cured by exposure to ultraviolet radiation for ten seconds. The radiation was emitted by a mercury vapor and metallic iodide lamp without a reflector, the front end of said lamp being located at a distance of 1 cm from the surface of the paper; the emission spectrum was between 275 and 450 nm and having a maximum between 360 and 380 nm.

By simple finger rubbing, it was determined that there existed no traces of gumming on the coated surface of the paper; the layer was thus suitably hardened and was permanently affixed.

Next, test specimens were prepared by cutting several 200×50 mm sample pieces from the paper coated with the silicone. To each specimen, on the coated face surface thereof, an adhesive tape having the dimensions of 150×19 mm was applied.

The test specimens were placed on a metal plate and then allowed to stand for 20 h at 70° C.; during this period same were subjected to a pressure of 18 g/cm² by placing over their entire surface a number of small steel plates.

Subsequent to this treatment, the specimens were exposed for one hour to ambient air at an approximate temperature of 20° C. The adhesive tape on each specimen was then stripped from the surface of the paper, the stripping force being exerted by means of a dynamometer, with the speed of removal being 200 mm/minute. A stripping force of 12 g per 1 cm of the width of the tape was measured. This value demonstrates the good release characteristics imparted by the silicone coating.

EXAMPLE 2

Eight experiments were carried out, repeating the procedure of the step (a) of Example 1; however, the respective amounts of the $\alpha,\omega$-dihydroxydimethylpolysiloxane oil having a viscosity of 100 mPa.s at 25° C. and of the silane having the formula $CH_2=C(CH_3)COO(CH_2)_3Si(OCH_3)_3$, were varied, as was the nature of the extent and duration of the heating of the three reaction components. In each experiment, the amount of tetraisopropyl titanate remained the same, i.e., 0.2 parts.

The data generated as a result of these experiments and the viscosities of the resultant organopolysiloxanes are reported in the following Table I:

It was found that all of the final compositions provided good, durable and lasting release characteristics (no gumming in the finger test and a stripping force of less than 20 g/cm), except those of the Experiments $d_1$ and $d_5$. These two compositions were not stable in storage and same were poorly hardened upon exposure to ultraviolet radiation; indeed, an exposure time of 90 seconds was required vis-a-vis the 10 to 25 second exposure utilized for the other compositions, while still yielding but mediocre release properties (gumming in finger test).

EXAMPLE 3

The following were charged into the reactor utilized in Example 1:

[i] 93 parts of an $\alpha,\omega$-dihydroxydimethylpolysiloxane oil having a viscosity of approximately 100 mPa.s at 25° C., comprising 0.7% free hydroxyl groups,

[ii] 7 parts of a silane of the formula:

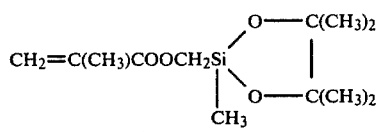

[iii] 0.2 part of isopropyl titanate.

The molar ratio of the free OH radicals of the oil to the silane radicals of the formula:

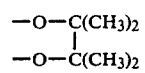

was approximately 0.7 (two SiOH radicals were considered as one —O—C(CH₃)₂—C(CH₃)₂—O— radical).

The contents of the reactor were heated from 23° C. to 140° C. over a period of 35 minutes; same was then maintained at this final temperature for 30 minutes.

During this treatment trace amounts of water were

TABLE I

| Experiment | Amount of Oil, in parts | Amount of Silane, in parts | Molar Ratio, OH/OCH₃ | Extent and Duration of Heating | Amount of Methanol evolved, in % with respect to theoretical amount | Viscosity in mPa.s at 25° C. of resultant composition | |
|---|---|---|---|---|---|---|---|
| | | | | | | At the outlet of the reactor | After 30 days of conditioning in a closed, opaque container |
| d₁ | 97.9 | 2.1 | 1.5 | from 23 to 160° C. in 40 min. | 10 | 330 | gelled |
| d₂ | 96.6 | 3.4 | 0.95 | from 23 to 160° C. in 25 min. | 19 | 600 | 2500 |
| d₃ | 95.4 | 4.6 | 0.7 | to 23° C. over 96 h. | zero | 350 | 1000 |
| d₄ | 95.4 | 4.6 | 0.7 | from 23° C. to 90° C. in 30 min. + 1 h. at 90° C. | 1.9 | 360 | 1000 |
| d₅ | 95.4 | 4.6 | 0.7 | from 23 to 160° C. in 60 min. | 50 | 2400 | gelled |
| d₆ | 93.8 | 6.2 | 0.5 | from 23 to 140° C. in 30 min. | 15 | 450 | 2000 |
| d₇ | 90.1 | 9.9 | 0.3 | from 23 to 140° C. in 30 min. | 11 | 200 | 240 |
| d₈ | 75.1 | 24.9 | 0.1 | from 23 to 150° C. in 40 min. | 15 | 240 | 300 |

The anti-stick or release characteristics imported by coating onto a paper substrate and then curing were measured, exactly in accordance with the step (b) of Example 1.

collected, but no traces of a diol of the formula:

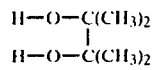

The resultant clear liquid had a viscosity of 315 mPa.s at 25° C.

The coating/hardening/testing procedure of step (b) of Example 1 was next carried out, with the Kraft paper weighing 67 g/m² and being coated with a mixture comprising 100 parts of the aforesaid clear liquid and 4 parts of the aforenoted mixture of butyl and isobutyl ethers of benzoin. It was found that the silicone layer, hardened by 20 second exposure to ultraviolet radiation, resisted gumming, and that the force necessary to strip off the adhesive tape from the paper was on the order of 15 g/cm.

EXAMPLE 4

Three experiments were carried out by repeating the procedure of step (a) of Example 1; however, the $\alpha,\omega$-dihydroxydimethylpolysiloxane oil having a viscosity of 100 mPa.s at 25° C. was respectively replaced by each of the three $\alpha,\omega$-dihydroxydimethylpolysiloxanes $A_1$, $A_2$ and $A_3$, having the following characteristics:

$A_1$, viscosity of 60 mPa.s at 25° C., having 3.7% free OH groups $A_2$, viscosity of 500 mPa.s at 25° C., having 0.40% free OH groups $A_3$, viscosity of 750 mPa.s at 25° C., having 0.3% free OH groups.

The data relative to the conduct and conditions of the three experiments, in particular regarding the respective amounts of the oils $A_1$, $A_2$, $A_3$ and of the silane of the formula $CH_2=C(CH_3)COO(CH_2)_3Si(OCH_3)_3$, together with the viscosity of the resultant compositions, are reported in the following Table II.

In each experiment, the isopropyl titanate is used in an amount of 0.2 part per 100 parts of the total amount of oil + silane; otherwise, the molar ratio of the SiOH functions of each oil to the $OCH_3$ functions of silane remained constant (on the order of 0.7).

The anti-stick or release characteristics imparted upon paper coating and hardening of the compositions of Experiments $e_1$, $e_2$ and $e_3$ were measured utilizing the procedure of step (b) of Example 1. It was found that:

(1) The use of the oil $A_1$ in Experiment $e_1$ afforded mediocre release properties because the stripping force required was 80 g/cm, while at the same time cross-linking required the rather lengthy exposure time of 45 seconds;

(2) The use of the oil $A_2$ in Experiment $e_2$ afforded good release properties, the stripping force required being 30 g/cm for a cross-linking exposure of 20 seconds; and (3) The use of the oil $A_3$ in Experiment $e_3$ afforded poor release properties, even though the duration of cross-linking was 55 seconds (the coating was easily removed upon "gumming" and, furthermore, the composition rapidly gelled in storage.

EXAMPLE 5

The subject composition had a viscosity of 350 mPa.s at 25° C. (listed under Experiment $d_3$ in Table I of Example 2), and was prepared by agitation at ambient temperature, for 96 hours, of the $\alpha,\omega$-dihydroxydimethylpolysiloxane oil having a viscosity of 100 mPa.s at 25° C. with the silane having the formula $CH_2=C(CH_3)—COO(CH_2)_3Si(OCH_3)_3$ in the presence of the isopropyl titanate.

To this composition, designated hereafter as $P_1$, varying amounts of the mercaptosilane of the formula $HS(CH_2)_3Si(OCH_3)_3$ were added, to provide, for each of the respective new compositions, a different molar ratio of $CH_2=C(CH_3)COO$ radicals to HS radicals. Varying amounts of the photoinitiator utilized in step (b) of Example 1 were also added. Subsequently, in accordance with the method set forth in step (b) of Example 1, exposure to ultraviolet radiation provided effective, durable and lasting release properties (no gumming and a stripping force of less than 30 g/cm).

The data relative to the proportions of the components of the new compositions, together with the duration of cross-linking are reported in the following Table III:

TABLE II

| Experiment | Amount of Oil, in parts | Amount of Silane, in parts | Extent and Duration of Heating | Amount of Methanol evolved, in % with respect to theoretical amount | Viscosity in mPa.s at 25° C. of resultant composition | |
|---|---|---|---|---|---|---|
| | | | | | At the outlet of the reactor | After 30 day of conditioning in a closed, opaque container |
| $e_1$ | ($A_1$) 79.3 | 20.7 | from 23° C. to 160° C. in 40 min. | 26 | 50 | 250 |
| $e_2$ | ($A_2$) 95.4 | 4.60 | from 23° C. to 145° C. in 49 min. | 4.8 | 5000 | 10000 |
| $e_3$ | ($A_3$) 98.06 | 1.94 | from 23° C. to 145° C. in 49 min. | traces | 35000 | gelled |

TABLE III

| Experiment | Constitution of each new composition | | $CH_2=C(CH_3)COO/HS$ molar ratio | Amount of photoinitiator | Duration of exposure to ultraviolet radiation, in seconds |
|---|---|---|---|---|---|
| | Amount of Composition $P_1$ | Amount of mercaptosilane | | | |
| $f_1$ | 100 | 0 | | 4 | 10 |
| $f_{1'}$ | 100 | 0 | | 1 | 20 |
| $f_2$ | 99.6 | 0.4 | 9 | 4 | 4 |
| $f_{2'}$ | 99.6 | 0.4 | 9 | 1 | 20 |

TABLE III-continued

| Experiment | Constitution of each new composition | | $CH_2=C(CH_3)COO/HS$ molar ratio | Amount of photoinitiator | Duration of exposure to ultraviolet radiation, in seconds |
| --- | --- | --- | --- | --- | --- |
| | Amount of Composition $P_1$ | Amount of mercaptosilane | | | |
| $f_3$ | 98.8 | 1.2 | 3 | 4 | 2 |
| $f_{3'}$ | 98.8 | 1.2 | 3 | 1 | 10 |
| $f_4$ | 96.3 | 3.7 | 1 | 4 | 2 |
| $f_{4'}$ | 96.3 | 3.7 | 1 | 1 | 8 |
| $f_5$ | 88.7 | 11.3 | 0.3 | 4 | 2 |
| $f_{5'}$ | 88.7 | 11.3 | 0.3 | 1 | 2 |

This example demonstrates that the incorporation of mercaptosilane is beneficial; on the one hand, it permits the appreciable reduction of the duration of exposure to radiation, while on the other enabling the utilizing of but small amounts of the photoinitiator.

EXAMPLE 6

(a1) Into the reactor used in Example 1, the following were charged:

[i] 96.3 parts of an α,ω-dihydroxydimethylpolysiloxane oil having a viscosity of approximately 100 mPa.s at 25° C., comprising 0.7% free hydroxyl groups;

[ii] 3.7 parts of a silane of the formula $HS(CH_2)_3Si(OCH_3)_3$; and

[iii] 0.2 part of isopropyl titanate.

The molar ratio of the OH groups of the oil to the $OCH_3$ functions of the mercaptosilane was approximately 0.7.

The contents of the reactor were stirred for 96 hours at ambient temperature. There resulted a composition, designated $P_2$ hereafter, which was clear and had a viscosity of 300 mPa.s at 25° C.; such viscosity increased to 1000 mPa.s at 25° C. after 30 days of conditioning in a closed container, and it then stabilized at this value.

To this $P_2$ composition, varying amounts of the methacryloxysilane of the formula $CH_2=C(CH_3)COO(CH_2)_3Si(OCH_3)$ were added, to provide, for each of the respective new compositions, a different molar ratio of $CH_2=C(CH_3)COO$ radicals to HS radicals. Varying amounts of the photoinitiator utilized in step (b) of Example 1 were also added. Subsequently, exposure to UV radiation provided effective, durable and lasting release properties, characterized by good resistance to gumming and a required stripping force of less than 30 g/cm.

Data relative to the proportions of the components of the new compositions and the duration of the photoinitiated cross-linking are reported in the following Table IV:

rubbing, while the force required to strip the adhesive tape from the paper surface was less than 30 g/cm.

It will be seen from the Table IV that the presence of the methacryloxysilane is necessary to impart good resistance to gumming; same further enables a decrease in the duration of the photoinitiated cross-linking; best results are obtained with the compositions of Experiments $g_2$ and $g_{2'}$, which have a molar ratio of the radicals $CH_2=C(CH_3)COO/HS$ on the order of 1.

(b1) As a comparison, the procedure reported hereinabove as (a1) was repeated, except that 97.4 parts of the α,ω-dihydroxydimethylpolysiloxane oil having a viscosity of 100 mPa.s at 25° C. and 2.6 parts of the silane of the formula $HS(CH_2)_3Si(OCH_3)_3$ were employed. Such amounts represent a molar ratio of the OH radicals of the oil to the $OCH_3$ functions of the mercaptosilane of approximately 1.

The composition had a viscosity of 425 mPa.s at 25° C.

To 75.3 parts of this composition, 24.7 parts of the aforementioned methacryloxysilane were added, thus establishing a molar ratio of the $CH_2=C(CH_3)COO$ radicals to the HS radicals on the order of 1.

To 200 parts of this mixture, 4 parts of the photoinitiator utilized in step (b) of Example 1 were added, followed by exposure to ultraviolet radiation. It was found that for an exposure time of 20 seconds the hardened silicone layer did not resist gumming per the finger test; in view of the results reported in Table IV, it will be seen that it is necessary to use (prior to the addition of the methacryloxysilane) an initial composition having a molar ratio of the OH radicals of the oil of the $OCH_3$ functions of the mercaptosilane of 1.

Again as a comparison, the procedure reported hereinabove as (a1) was again repeated, except that 98.4 parts of an α,ω-dihydroxydimethylpolysiloxane oil having a viscosity of 750 mPa.s at 25° C., having 0.3% free OH groups, in place of the oil having the viscosity of 100 mPa.s at 25° C., and 1.6 parts of a silane of the formulas $HS(CH_2)_3Si(OCH_3)_3$ were employed, the

TABLE IV

| Experiment | Constitution of new compositions | | Molar ratio, $CH_2=C(CH_3)COO$ radicals to HS radicals | Amount of photoinitiator | Duration of exposure to ultraviolet radiation, in seconds |
| --- | --- | --- | --- | --- | --- |
| | Amount of composition $P_2$ | Amount of methacryloxysilane | | | |
| g | 100 | 0 | | 0 | 10 |
| g' | 100 | 0 | | 4 | 10 |
| $g_1$ | 98.6 | 1.4 | 0.3 | 4 | 5 |
| $g_{1'}$ | 98.6 | 1.4 | 0.3 | 1 | 6 |
| $g_2$ | 95.5 | 4.5 | 1 | 4 | 1 |
| $g_{2'}$ | 95.5 | 4.5 | 1 | 1 | 7 |
| $g_3$ | 87.6 | 12.4 | 3 | 4 | 6 |
| $g_{3'}$ | 87.6 | 12.4 | 3 | 1 | 7 |
| $g_4$ | 70.2 | 29.8 | 9 | 4 | 6 |
| $g_{4'}$ | 70.2 | 29.8 | 9 | 1 | 12 |

The coatings obtained from the compositions of Experiments g and g' are removed rather easily by finger molar ratio of the OH radicals of the oil to the $OCH_3$ functions of the mercaptosilane remained at 0.7.

It was found that the resultant liquid, having a viscosity of 30,000 mPa.s at 25° C., was not storage stable; in particular, same gelled after a conditioning period of ten days in a closed container, at ambient temperature. It will thus also be seen, in view of the stability exhibited by the composition $P_2$, that it is necessary to utilize an oil having a viscosity less than 750 mPa.s.

EXAMPLE 7

Several compositions were prepared simply by mixing together at ambient temperature varying amounts of the composition $P_1$ (described in Example 5), prepared from the α,ω-dihydroxydimethylpolysiloxane oil having a viscosity of 100 mPa.s at 25° C., and the methacryloxysilane of the formula $CH_2=C(CH_3)COO(CH_2)_3Si(OCH_3)_3$, with the composition $P_2$ (described in Example 6), prepared from the same α,ω-dihydroxydimethylpolysiloxane oil and the mercaptosilane of the formula $HS(CH_2)_3Si(OCH_3)_3$.

The effectiveness of each composition was determined with respect to its release characteristics by the procedure of step (b) of Example 1; in each composition, two different amounts of the photoinitiator comprising the 50/50 by weight admixture of the butyl and isobutyl ethers of benzoin were added, and each new mixture was exposed to ultraviolet radiation emitted via that apparatus also described in step (b) of Example 1. Subsequently, exposure to the UV radiation provided good release properties, which remained constant over time; the coating was also resistant to gumming by the finger test, and the required stripping force to remove the adhesive tape was less than 30 g/cm.

Data relative to the proportions of the components of the test and the extent of cross-linking are reported in the following Table V:

TABLE V

| Experiment | Constitution of each new composition | | Molar ratio, $CH_2=C(CH_3)COO$ radicals to HS radicals | Amount of photoinitiator | Duration of photoinitiated cross-linking |
|---|---|---|---|---|---|
| | Amount of composition $F_1$ | Amount of composition $P_2$ | | | |
| K | 100 | 0 | | 4 | 8 |
| K' | 0 | 100 | | 0 | 10 |
| $K_1$ | 22.5 | 77.5 | 0.3 | 4 | 1 |
| $K_1'$ | 22.5 | 77.5 | 0.3 | 1 | 4 |
| $K_2$ | 49.1 | 50.9 | 1 | 4 | 1 |
| $K_2'$ | 49.1 | 50.9 | 1 | 1 | 2 |
| $K_3$ | 74.3 | 25.7 | 3 | 4 | 3 |
| $K_3'$ | 74.3 | 25.7 | 3 | 1 | 6 |
| $K_4$ | 89.7 | 10.3 | 9 | 4 | 12 |
| $K_4'$ | 89.7 | 10.3 | 9 | 1 | 24 |

It will be seen that in the Experiment K' the coated layer did not resist gumming by the finger test.

It will also be seen from the results reported in Table V that mixed compositions displaying molar ratios of $CH_2=C(CH_3)COO$ radicals to HS radicals ranging from 0.3 to 3 were cross-linked in but very short periods of time, utilizing only small amounts of photoinitiator.

While the invention has been described in terms of various preferred embodiments, the skilled artisan will appreciate that various modifications, substitutions, omissions, and changes may be made without departing from the spirit thereof. Accordingly, it is intended that the scope of the present invention be limited solely by the scope of the following claims.

What is claimed is:

1. A liquid, storage stable organopolysiloxane having a viscosity of from 60 mPa.s to 20,000 mPa.s at 25° C., comprising the reaction product of (i) an α,ω-dihydroxydiorganopolysiloxane oil, the organo functions being selected from the group consisting of methyl, ethyl, n-propyl, vinyl, phenyl and trifluoropropyl, with at least 70% of such functions being methyl and no greater than 3% being vinyl, and said oil having a viscosity ranging from about 70 to 500 mPa.s at 25° C., (ii) a silane having the formula $Z(G)SiR_a(Q)_{3-a}$ wherein Z is $CH_2=C(R')—COO—$ or $HS—$, and further wherein the symbols R, which may be the same or different, are methyl, ethyl, n-propyl, vinyl or phenyl, R' is hydrogen or methyl, the symbols Q, which may be the same or different, are methoxy, ethoxy, n-propoxy, β-methoxyethoxy or, when any two are taken together, the divalent radical $—O—C(CH_3)_2—C(CH_3)_2—O—$, G is a linear or branched chain alkylene radical having from 1 to 8 carbons, a is a number ranging from 0 to 2; and (iii) a catalyst selected from the group consisting of alkyl titanates and polytitanates and diorganotin salts of aliphatic carboxylic acids, said organopolysiloxane being prepared by reacting an intimate admixture of the α,ω-dihydroxydiorganopolysiloxane (i), the silane (ii) and the catalyst (iii) wherein the ratio of the hydroxyl functions of the oil (i) to the Q radicals of the silane (ii) comprises from about 0.1 to about 0.95 at a temperature of from about 5° to 180° C. for a contact time such that no greater than 45% by weight of the theoretical amount of byproduct alcohol, QH, is evolved during the reaction.

2. The organopolysiloxane as defined by claim 1, wherein the silane (ii), Z is $CH_2=C(R')—COO—$.

3. The organopolysiloxane as defined by claim 1, wherein the silane (ii), Z is $HS—$.

4. The organopolysiloxane as defined by claim 2, wherein R' is hydrogen.

5. The organopolysiloxane as defined by claim 2, wherein R' is methyl.

6. The organopolysiloxane as defined by claim 1, wherein the oil (i) has a viscosity of from 80 mPa.s to 400 mPa.s at 25° C.

7. The organopolysiloxane as defined by claim 2, the silane (ii) being selected from the group consisting of
$CH_2=CH—COOCH_2Si(CH_3)(OCH_3)_2$,
$CH_2=CH—COO(CH_2)_3Si(OC_2H_5)_3$,
$CH_2=CHCOO(CH_2)_3Si(OCH_3)_3$,
$CH_2=CH—COO(CH_2)_4Si(OCH_2CH_2OCH_3)_3$,
$CH_2=CH—COO(CH_2)_3Si(On—C_3H_7)_3$,
$CH_2=CH—COOCH_2CH(CH_3)CH_2Si(CH=CH_2)(OCH_3)_2$, $CH_2=C(CH_3)COOCH_2Si—CH_3(OCH_3)_2$,
$CH_2=C(CH_3)COO(CH_2)_3Si(OCH_3)_3$,
$CH_2=C(CH_3)COO(CH_2)_3Si(OC_2H_5)_3$, $CH_2=C(CH_3)COO(CH_2)_3Si(OCH_2CH_2OCH_3)_3$,
$CH_2=C(CH_3)COO(CH_2)_3Si(CH_3)_2OCH_3$,
$CH_2=C(CH_3)COO(CH_2)_4Si(C_6H_5)(OCH_3)_2$,
$CH_2=C(CH_3)COO(CH_2)_4CH(C_2H_5)CH_2Si(C_2H_5)(OCH_3)_2$, and

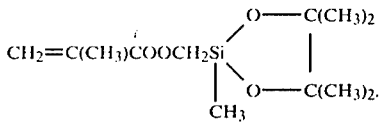

8. The organopolysiloxane as defined by claim 3, the silane (ii) being selected from the group consisting of $HS(CH_2)_3Si(OCH_3)_3$, $HSCH_2SiCH_3(OC_2H_5)_2$, $HS(CH_2)_4SiCH_3(OCH_3)_2$, $HS(CH_2)_4Si(CH_3)_2OC_2H_5$, $HSCH_2CH(CH_3)CH_2SiCH_3(OC_2H_5)_2$, $HS(CH_2)_3SiCH_3(OC_2H_5)_2$, $HS(CH_2)_3SiCH=CH_2(OC_2H_5)_2$, $HS(CH_2)_3SiC_6H_5(OCH_3)_2$, and $HSCH_2CH(CH_3)CH_2Si(OC_2H_5)_3$.

9. The organopolysiloxane as defined by claims 2 or 3, wherein the molar ratio of the hydroxyl functions comprising the oil (i) to the Q radicals comprising the silane (ii) ranging from 0.2 to 0.85.

10. The organopolysiloxane as defined by claims 2 or 3, having a viscosity of from 150 mPa.s to 15,000 mPa.s at 25° C.

11. A liquid, storage stable organopolysiloxane composition comprising the organopolysiloxane as defined by claim 2, and a silane having the formula $HS(G)SiR_a(Q)_{3-a}$.

12. A liquid, storage stable organopolysiloxane composition comprising the organopolysiloxane as defined by claim 3, and a silane having the formula $CH_2=C(R')—COO(G)SiR_a(Q)_{3-a}$.

13. A liquid, storage stable organopolysiloxane composition comprising a first organopolysiloxane, as defined by claim 2, and a second organopolysiloxane which comprises the reaction product of the same α,ω-dihydroxydiorganopolysiloxane oil as comprises said first organopolysiloxane, with a silane having the formula $HS(G)SiR_a(Q)_{3-a}$.

14. The organopolysiloxane composition as defined by claim 11, comprising amounts of organopolysiloxane and silane such that the molar ratio of the radicals $CH_2=C(R')COO—$, provided by said organopolysiloxane, to the radicals $HS—$, provided by said silane, is greater than 0.05.

15. The organopolysiloxane composition as defined by claim 14, said molar ratio ranging from 0.05 to 15.

16. The organopolysiloxane composition as defined by claim 15, said molar ratio ranging from 0.2 to 12.

17. The organopolysiloxane composition as defined by claim 12, comprising amounts of organopolysiloxane and silane such that the molar ratio of the radicals $CH_2=C(R')COO—$, provided by said silane, to the radicals $HS—$, provided by the organopolysiloxane, is greater than 0.05.

18. The organopolysiloxane composition as defined by claim 17, said molar ratio ranging from 0.05 to 15.

19. The organopolysiloxane composition as defined by claim 18, said molar ratio ranging from 0.1 to 8.

20. The organopolysiloxane composition as defined by claim 13, comprising amounts of the respective organopolysiloxanes such that the molar ratio of the radicals $CH_2=C(R')COO—$, provided by said first organopolysiloxane, to the radicals $HS—$, provided by said second organopolysiloxane, is greater than 0.5.

21. The organopolysiloxane composition as defined by claim 20, said molar ratio ranging from 0.05 to 15.

22. The organopolysiloxane composition as defined by claim 21, said molar ratio ranging from 0.1 to 10.

23. The organopolysiloxane as defined by way of claims 3, 4, 5, 7 or 8, further comprising a photopolymerization inducing amount of a photoinitiator.

24. The organopolysiloxane composition as defined by any of claims 11, 12, 13, 14, 17 or 20, further comprising a photopolymerization inducing amount of a photoinitiator.

25. The organopolysiloxane as defined by claim 23, containing, per each 100 parts by weight thereof, 0.1 to 10 parts by weight of photoinitiator.

26. The organopolysiloxane composition as defined by claim 24, containing, per each 100 parts by weight thereof, 0.1 to 10 parts by weight of photoinitiator.

27. The organopolysiloxane as defined by claim 25, wherein said photoinitiator is a benzoin, xanthone or thioxanthone derivative.

28. The organopolysiloxane composition as defined by claim 26, wherein said photoinitiator is a benzoin, xanthone or thioxanthone derivative.

29. The organopolysiloxane as defined by any of claims 3, 4, 5, 7 or 8, in photocured state.

30. The organopolysiloxane composition as defined by any of claims 11, 12, 13, 14, 17 or 20, in photocured state.

31. A substrate coated with the organopolysiloxane as defined by claim 29.

32. The coated substrate as defined by claim 31, the substrate being selected from the group consisting of cellulosics and natural and synthetic polymers.

33. A substrate coated with the organopolysiloxane composition as defined by claim 30.

34. The coated substrate as defined by claim 33, the substrate being selected from the group consisting of cellulosics and natural and synthetic polymers.

35. A process for the preparation of the liquid, storage stable organopolysiloxane as defined by claim 1, comprising contacting an intimate admixture of the α,ω-dihydroxydiorganopolysiloxane oil (i), the silane (ii), and (iii) a catalyst selected from the group consisting of alkyl titanates and polytitanates, and diorganotin salts of aliphatic carboxylic acids, at a temperature ranging from about 5° to 180° C., while evolving byproduct QH alcohol therefrom, and for a contact time no longer than that required to evolve 45% of the theoretical amount of said byproduct alcohol, QH, formed during the reaction.

36. The process as defined by claim 35, the admixture comprising 0.05 to 2 parts by weight catalyst (iii) per 100 total parts by weight of the oil (i) and silane (ii).

37. The process as defined by claim 36, the admixture comprising 0.1 to 1 part by weight catalyst (iii) per 100 total parts by weight of the oil (i) and silane (ii).

38. The process as defined by claims 36, wherein the catalyst (iii) has the formula $Ti[(OCH_2CH_2)_bOR'']_4$ wherein R'' is alkyl having from 1 to 8 carbon atoms, and b is zero or 1.

39. The process as defined by claim 36, wherein the catalyst (iii) is the polytitanate product of partial hydrolysis of a titanate having the formula $Ti(OR'')_4$ wherein R'' is alkyl having from 2 to 8 carbon atoms.

40. The process as defined by claim 36, wherein the catalyst (iii) has the formula $(R'''COO)_2SnT_2$ wherein R''' is an aliphatic hydrocarbon having from 1 to 25 carbon atoms and T is alkyl having from 1 to 10 carbon atoms.

41. The process as defined by claim 36, said contact time ranging from about 5 to 90 minutes.

42. The process as defined by claim 41, the contacting being under atmospheric pressure, at a temperature ranging from about 120° to 160° C.

43. A process for the preparation of the liquid, storage stable organopolysiloxane as defined by claim 1, comprising contacting an intimate admixture of the $\alpha,\omega$-dihydroxydiorganopolysiloxane oil (i), the silane (ii), and (iii) a catalyst selected from the group consisting of alkyl titanates and polytitanates, and diorganotin salts of aliphatic carboxylic acids, at a temperature ranging from between 5° and 90° C., for a contact time of at least 10 hours, and in the substantial absence of evolution of byproduct QH alcohol therefrom.

* * * * *